United States Patent [19]

Nomura et al.

[11] Patent Number: 5,087,307
[45] Date of Patent: Feb. 11, 1992

[54] METHOD OF MANUFACTURING SEMICONDUCTOR SUBSTRATE

[75] Inventors: Takehiko Nomura; Yoshinori Natsume, both of Yokohama; Yoshinori Hosoki, Kawasaki, all of Japan

[73] Assignee: Kabushiki Kaisha Toshiba, Kawasaki, Japan

[21] Appl. No.: 620,450

[22] Filed: Dec. 3, 1990

Related U.S. Application Data

[63] Continuation of Ser. No. 273,177, Nov. 15, 1988, abandoned, which is a continuation of Ser. No. 927,389, Nov. 6, 1986, abandoned.

[30] Foreign Application Priority Data

Dec. 27, 1985 [JP] Japan .................. 60-292577

[51] Int. Cl.5 .................................... B32B 31/14
[52] U.S. Cl. ................... 156/154; 156/153; 156/257; 156/155; 51/283 E; 51/323
[58] Field of Search .............. 156/257, 153, 154, 155, 156/645; 437/225, 249; 51/283 R, 283 E, 237 R, 323, 132

[56] References Cited

U.S. PATENT DOCUMENTS

| | | | |
|---|---|---|---|
| 369,074 | 8/1887 | Pearce et al. | 51/283 E |
| 3,355,636 | 11/1967 | Becke et al. | 29/576 J |
| 3,475,867 | 11/1969 | Walsh | 156/155 X |
| 3,503,125 | 3/1970 | Haberecht | 29/576 J |
| 3,567,547 | 3/1971 | Mattson et al. | 51/283 R X |
| 4,331,452 | 5/1982 | Causey et al. | 51/283 R X |

FOREIGN PATENT DOCUMENTS

| | | |
|---|---|---|
| 0136050 | 4/1985 | European Pat. Off. |
| 0924371 | 1/1955 | Fed. Rep. of Germany |
| 3026272 | 1/1981 | Fed. Rep. of Germany |
| 50-13155 | 5/1975 | Japan |
| 106762 | 8/1980 | Japan ........ 51/283 E |

Primary Examiner—Michael W. Ball
Assistant Examiner—Jeff H. Aftergut
Attorney, Agent, or Firm—Finnegan, Henderson, Farabow, Garrett, and Dunner

[57] ABSTRACT

A method of manufacturing a semiconductor substrate comprises a first step of preparing one hundred silicon bodies each having two silicon wafers held together by cohesion after polishing and heating processes. The method further comprises a second step of stacking the silicon bodies in their thickness direction to form a stacked body, and a third step of cylindrically grinding the side surface of the stacked body by a predetermined amount.

15 Claims, 2 Drawing Sheets

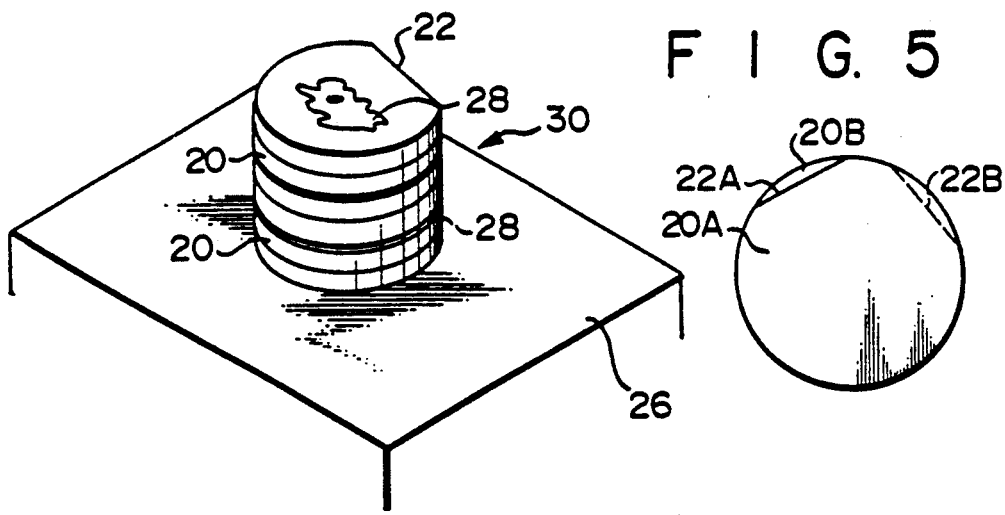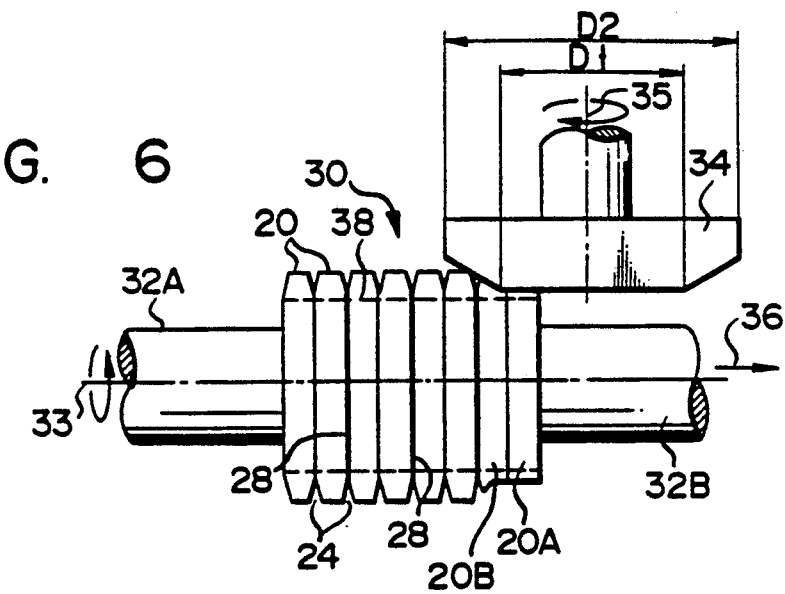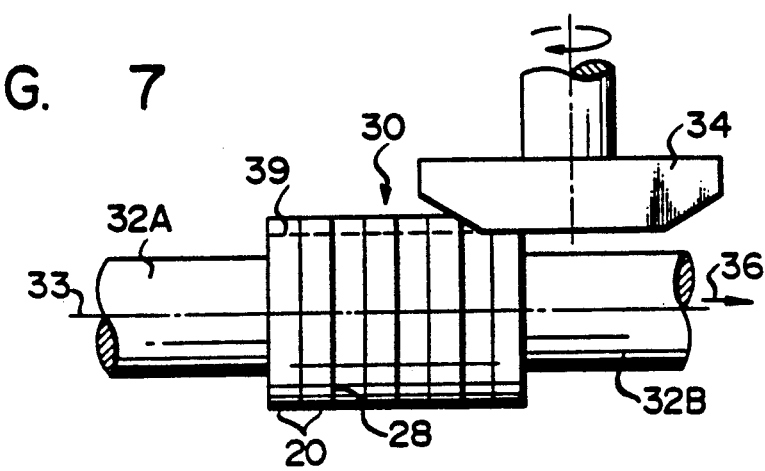

5,087,307

METHOD OF MANUFACTURING SEMICONDUCTOR SUBSTRATE

This application is a continuation of application Ser. No. 07/273,177, filed Nov. 15, 1988, now abandoned, which is a continuation of application Ser. No. 06/927,389, filed Nov. 6, 1986, now abandoned.

BACKGROUND OF THE INVENTION

The present invention relates to a method of manufacturing a semiconductor substrate and, more particularly, to a method of manufacturing a semiconductor substrate having a plurality of semiconductor wafers held together by cohesion.

Recently, a technique of bonding semiconductor wafers is preferred for the reduction in a manufacturing cost it achieve. In this bonding technique, at least two semiconductor wafers are polished to have mirror surfaces and directly bonded together, constituting a semiconductor substrate. For example, in the manufacture of a high withstand voltage bipolar transistor of the type having a buried region, the bonding technique allows a step of forming the buried region to be free from a complex conventional process in which diffusion and epitaxial growth would be combined. In this case, a buried region is easily provided by uniting a first semiconductor wafer and a second semiconductor wafer having a diffusion region in its surface area. This type of semiconductor substrates can be mass-produced in advance independently of the manufacture of bipolar transistors with a high withstand voltage, thereby effectively reducing the time required for building high withstand voltage bipolar transistors on one semiconductor substrate.

A method of manufacturing a semiconductor substrate of this type will now be described in detail. To bond two semiconductor wafers, semiconductor wafers are polished at their major surfaces to have mirror surfaces and stacked with the polished surfaces being opposed each other. Thereafter, semiconductor wafers are heated to be held together with sufficient coherency, thus forming a semiconductor body shown in FIG. 1. The semiconductor body is then ground by a predetermined amount to adjust its thickness. Thus, a semiconductor substrate having a thickness suitable for forming semiconductor elements is obtained.

In general, a polishing process cannot maintain a thickness of a semiconductor wafer constant and dulls a peripheral edge of a polished surface as a whole. For this reason, when two semiconductor wafers are polished and stacked together, a wedge-shaped gap is formed between outer peripheries of the semiconductor wafers. This gap remains as a noncohered portion of a semiconductor body after a heating process and causes a part of the semiconductor body to be chipped off during a thickness adjustment process, as shown in FIG. 2. In addition, when a semiconductor substrate is wet-washed prior to the formation of a desired semiconductor element, a wash enters into the gap. The wash scatters from the gap during semiconductor element manufacturing processes, e.g., a heating process or a vacuum deposition and contaminates an essential part of the semiconductor substrate. Accordingly, an outer periphery of the semiconductor body must be ground to be free of the gap described above.

SUMMARY OF THE INVENTION

It is an object of the present invention to provide a method of manufacturing a semiconductor substrate, which is capable of removing a noncohered portion of a semiconductor body, which consists wafers bonded by cohesion, in a sufficient short time and is suitable for mass production.

According to the present invention, there is provided a method of manufacturing a semiconductor substrate, comprising a first step of preparing a plurality of semiconductor bodies each including at least two semiconductor wafers held together by cohesion through polishing and heating processes, a second step of stacking the plurality of semiconductor bodies in the thickness direction, and a third step of cylindrically grinding side surfaces of the stacked semiconductor bodies by a predetermined amount.

According to the method, a plurality of semiconductor bodies are stacked in the thickness direction in the second step and then cylindrically ground in the third, step. Therefore, outer peripheries of a large number of semiconductor bodies can be simultaneously ground. Since the stacked semiconductor bodies can withstand an external pressure larger than that a single semiconductor body can withstand, side surfaces of the stacked semiconductor bodies can be ground by a required depth by one grinding step.

BRIEF DESCRIPTION OF THE DRAWINGS

FIG. 4 is a perspective view showing a step of stacking a plurality of semiconductor bodies in a method of manufacturing a semiconductor substrate according to an embodiment of the present invention;

FIG. 5 is a plan view for explaining a positional relationship between orientation flats of the plurality of semiconductor bodies stacked in the step of FIG. 4;

FIG. 6 is a front view showing a step of cylindrically grinding the semiconductor bodies stacked in the step of FIG. 4; and FIG. 7 is a front view showing a step of forming orientation flats in the semiconductor bodies after the step of FIG. 6.

DETAILED DESCRIPTION OF THE PREFERRED EMBODIMENT

Figure 1:
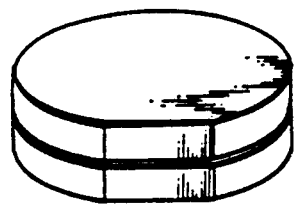
FIG. 1 is a perspective view of a conventional semiconductor body formed by polishing and heating two semiconductor wafers.
Figure 2:
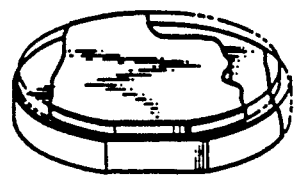
FIG. 2 is a perspective view of a semiconductor body a part of which has been chipped during a thickness adjustment process.
Figure 3A:
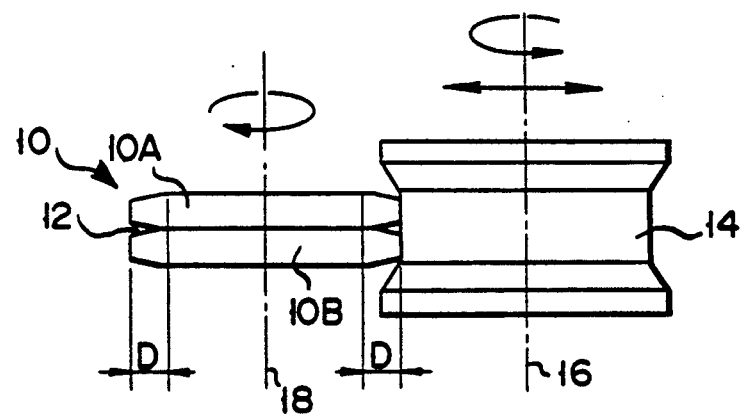
FIGS. 3A and 3B are front and plan views, respectively, showing how a noncohered portion of the semiconductor body shown in FIG. 1 is removed by a beveling or edge-grinding machine.
Figure 3B:
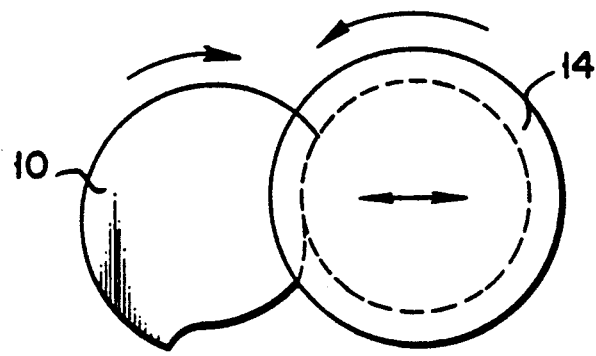

A process for completing the present invention will now be described. Semiconductor body 10 shown in FIGS. 3A and 3B is formed of semiconductor wafers 10A and 10B cohered through polishing and heating processes. These processes allow body 10 to have noncohered portion 12 (or a gap) left along its outer periphery. First, one of the present inventor removed portion 12 by a beveling (or edge-grinding) machine for a semiconductor wafer. The beveling machine has grinding wheel 14 supported to be reciprocally movable in the horizontal direction and rotatable about alternate long and short dashed line 16. On the other hand, body 10 is supported to be rotatable about alternate long and short dashed line 18. During a grinding operation, rotating wheel 14 is urged against a side surface of body 10, and body 10 rotates so that its outer periphery is ground as a whole. The problem previously described is solved by grinding the outer periphery of body 10 by depth D required for removing portion 12 using the beveling machine.

In order to reduce a total manufacturing cost, however, international standards for a diameter of a semiconductor substrate must be taken into consideration. In the standards, an integer inch and mm are used as a general size of semiconductor substrates. In general, processing machines and jigs are so designed as to process a semiconductor substrate suitable for the standards. If the standards are neglected, it is difficult to use these processing machines and jigs in the formation of semiconductor elements. For example, a semiconductor substrate having a diameter of 100 mm or 125 mm is suitable for the standards, but diameters between 100 mm and 125 mm are not accepted as general sizes in the standards.

Portion 12 normally has a width or depth of about 3 to 5 mm in a radial direction of body 10. Assume that body 10 with a diameter of 125 mm has portion 12 with a width of 3 mm. When an outer periphery of body 10 is uniformly ground by 3 mm corresponding to the width of portion 12, the diameter of body 10 is reduced to 119 mm. Since this diameter is not a general size, body 10 must be ground and set to have a diameter of 100 mm. As a result, the beveling machine must grind the outer periphery of body 10 by a total sum of 12.5 mm. Since the beveling machine is originally so designed as to give a bevel to a surface end of a semiconductor wafer, it takes a relatively long time for the machine to grind such a large amount.

An embodiment of the present invention as a more practical method of manufacturing a semiconductor substrate will now be described in detail with reference to FIGS. 4 to 7. FIGS. 4 to 7 are views showing steps for manufacturing a semiconductor substrate. In a first step, a plurality of, e.g., one hundred semiconductor bodies 20 are prepared.

Body 20 is formed of first and second silicon wafers 20A and 20B each having a different carrier concentration, a diameter of 125 mm and a thickness of 500 μm. Each of wafers 20A and 20B has a major surface with (100) orientation and orientation flat 22 with a length of 40 mm along a direction of <110>. In the formation of each body 20, wafers 20A and 20B are polished until one major surface of each of wafers 20A and 20B becomes a mirror surface. During this process, projections higher than 0.05 μm are removed from the polished surface, and a peripheral edge of the polished surface undesirably dulled.

After polishing, wafers 20A and 20B are processed, having oil and stain removed from their polished surfaces, as needed, and washed with sufficiently pure water. Then, wafers 20A and 20B are steeped in a solution of hydrofluoric acid and washed with sufficiently pure water. Instead, wafers 20A and 20B can be subjected to a rubbing treatment after polishing. In this case, rubbed wafers 20A and 20B are immersed in a mixed solution comprising hydrogen peroxide and sulfric acid, weight ratio thereof being one to three. Further, wafers 20A and 20B are immersed in a solution of aqua regia or a solution comprising hydrogen peroxide, hydrochloric acid, and hydrogen oxide.

In order to remove excess water, wafers 20A and 20B are spin-dried at room temperature after washing. Thereafter, they are stacked with their centers aligned and their polished surfaces opposed to each other. During this process, an inter-atomic attraction force acts to unite stacked wafers 20A and 20B. Stacked wafers 20A and 20B are heated in an extremely clean atmosphere in which about one dust of 0.5 μm or more is present per cubic foot. In order to sufficiently strengthen the coherency between wafers 20A and 20B, this heating process is performed at 200° C. or more and, more preferably, at 1,000 to 1,200° C. When it is performed at, for example, 1,100° C., the heating process is preferably continued for about 2 hours. Body 20 is thus completed. However, since the peripheral edge is dulled during polishing, portion 24 having a width of 3 to 5 mm remains along the outer periphery of semiconductor body 20 after the heating process.

One hundred bodies 20 are prepared in this manner and then stacked through a hot-melt adhesive, e.g., paraffin 28 as shown in FIG. 4. More specifically, bodies 20 are provided with paraffin 28 one by one and sequentially stacked by a jig (not shown) on heating plate 26 heated to 80 to 90° C. Paraffin 28 is melted with this heat and spreads properly between adjacent two bodies 20. Centers and orientation flats 22 of bodies 20 are aligned when each of them is housed in a jig (not shown) on heating plate 26. This also applies to a case in which wafers 20A and 20B of each body 20 have orientation flats 22A and 22B with an angle shown in FIG. 5. After being stacked, all of one hundred bodies 20 are transferred together with the jig to a cooling plate (not shown). One hundred bodies 20 are held together by solidification of paraffin 28 to constitute substantially cylindrical ingot-like stacked body 30.

Thereafter, stacked body 30 is cylindrically ground by a three-dimensional cylindrical grinder, as shown in FIG. 6. The three-dimensional cylindrical grinder is normally known as a processing machine for grinding a monocrystalline silicon ingot and manufactured by, e.g., Ueda Giken Co., Ltd., Japan, as model No. RS-80. The three-dimensional cylindrical grinder has support shafts 32A and 32B rotatable about alternate long and short dashed line 33 and reciprocally movable in the extending direction of line 33, grinding wheel 34 rotatable about alternate long and short dashed line 35 which is perpendicular to line 33, and a drive unit (not shown) thereof. Wheel 34 has inner diameter D1 of 56 mm, outer diameter D2 of 70 mm, and a grit of #150.

In this process, a side surface of stacked body 30 is first ground. Shafts 32A and 32B clamp body 30 as shown in FIG. 6 and urge it against wheel 34 rotating at a high speed. Body 30 is rotated at 12 rpm and moved at 20 to 30 mm/min along a direction indicated by arrow 36. The side surface of body 30 is thus ground by 1 mm for each rotation and ground by a depth of 12 mm as a whole as indicated by broken line 38 while crossing wheel 34. More specifically, body 30 is formed to have a diameter of 101 mm.

Thereafter, a process shown in FIG. 7 is performed to form a new orientation flat. In this process, the three-dimensional cylindrical grinder is again used. Body 30 which is cylindrically ground is again urged against wheel 34 rotating at a high speed as in the previous step. However, body 30 is moved at 20 to 30 mm/min along the direction indicated by arrow 36 without being rotated around shafts 32A and 32B this time. Wheel 34 horizontally grinds body 30 along broken line 39 to form a flat surface having a width of 30 mm at a predetermined peripheral surface portion of body 30.

Thereafter, body 30 is placed again on a heating plate heated to 80 to 90° C. Paraffin 28 is melted with this heat, thereby allowing body 30 to be separated into one hundred silicon bodies 20. Bodies 20 are stripped one by one and then washed to remove paraffin 28 with an organic solvent.

After paraffin 28 is completely removed, a thickness adjustment process of bodies 20 is performed by means of lapping. This lapping removes a major surface of each body 20 by a predetermined amount to set its thickness suitable for forming semiconductor elements.

After the thickness adjustment process, each body 20 is further chamfered to have a final diameter of 100 mm and thus completed as a semiconductor substrate for forming semiconductor elements.

According to this embodiment, outer peripheries of plural silicon bodies can be simultaneously ground by a required amount through the grinding process shown in FIG. 6. In this case, the time required for grinding a single silicon body is reduced to about 1/10 of that when, e.g., a beveling machine is used. More specifically, in this embodiment, the outer peripheries of ten silicon wafer cohered bodies can be ground in less than 30 minutes. On the other hand, when a beveling machine is used, substantially the same time is required for grinding an outer periphery of only a single silicon body.

We claim:

1. A method of manufacturing a semiconductor substrate comprising:
   a first step of polishing a pair of semiconductor wafers, each semiconductor wafer including a major surface having a central planar portion and an outer periphery and further including a side surface remote from the central planar portion and contiguous to the outer periphery, until the central planar portions of the major surfaces are mirror-finished and the outer peripheries are oblique to the respective central planar portions;
   a second step of stacking said semiconductor wafers with the polished surfaces opposed to each other, and heating the stacked semiconductor wafers to form a semiconductor body having a gap between the outer peripheries of the polished major surfaces of said semiconductor wafers formed by said polishing, stacking, and heating steps;
   a third step of preparing a plurality of semiconductor bodies each formed through said first and second steps;
   a fourth step of combining the plurality of semiconductor bodies atop each other to form a combined body having a side surface; and
   a fifth step of cylindrically grinding the side surface of the combined body by a predetermined amount required to at least remove said gap.

2. A method according to claim 1, further comprising a sixth step of coating an adhesive on each semiconductor body before said fourth step, and a seventh step of removing said adhesive from the semiconductor bodies after said fifth step by reheating the stack, removing each semiconductor body from the stack, and washing each body with an organic solvent.

3. A method according to claim 2, wherein said adhesive is of a hot-melt type.

4. A method according to claim 3, wherein said fourth step includes a first substep of stacking each semiconductor body coated with the hot-melt adhesive on a heating plate heated up to a predetermined temperature, and a second substep of cooling the stacked semiconductor bodies.

5. A method according to claim 2, further comprising an eighth step of plane-grinding the side surface of said combined body after said fifth step and before said seventh step, thereby forming an orientation flat in each semiconductor body.

6. A method according to claim 5, further comprising a ninth step of adjusting each semiconductor body into a predetermined thickness after said seventh step.

7. A method according to claim 1, wherein each semiconductor wafer has a surface from which projections higher than 0.05 μm are removed, through said first step.

8. A method according to claim 1, wherein said second step includes a first substep of heating the stacked semiconductor wafers at a temperature higher than 200° C.

9. A method according to claim 8, wherein said first substep is performed at a temperature of about 1,100° C. for about two hours.

10. A method of manufacturing a semiconductor substrate comprising:
    a first step of polishing a pair of semiconductor wafers, each semiconductor wafer including a major surface having a central planar portion and an outer periphery and further including a side surface remote from the central planar portion and contiguous to the outer periphery, until the central planar portions of the major surfaces are mirror-finished and the outer peripheries are oblique to the respective central planar portions;
    a second step of stacking said semiconductor wafers with the polished surfaces opposed to each other, and heating the stacked semiconductor wafers to form a semiconductor body having a gap between the outer peripheries of the polished major surfaces of said semiconductor wafers formed by said polishing, stacking, and heating steps;
    a third step of preparing a plurality of semiconductor bodies each formed through said first and second steps;
    a fourth step of combining the plurality of semiconductor bodies atop each other to form a combined body having a side surface;
    a fifth step of cylindrically grinding the side surface of the combined body by a predetermined amount required to at least remove said gap; and
    a sixth step of plane-grinding the side surface of said combined body after said fifth step, thereby forming an orientation flat in each semiconductor body.

11. A method according to claim 10, further comprising a seventh step of adjusting each semiconductor body into a predetermined thickness after said sixth step.

12. A method of manufacturing a semiconductor substrate comprising:
    a first step of polishing a pair of semiconductor wafers, each semiconductor wafer including a major surface having a central planar portion and an outer periphery and further including a side surface remote from the central planar portion and contiguous to the outer periphery, until the central planar portions of the major surfaces are mirror-finished and the outer peripheries are oblique to the respective central planar portions;

a second step of stacking said semiconductor wafers with the polished surfaces opposed to each other, and heating the stacked semiconductor wafers to form a semiconductor body having a gap between the outer peripheries of the polished major surfaces of said semiconductor wafers formed by said polishing, stacking, and heating steps; and a third step of grinding the side surfaces of said semiconductor wafers by a predetermined amount required to at least remove said gap.

13. A method according to claim 12, further comprising a fourth step of forming an orientation flat in said semiconductor body after said third step.

14. A method according to claim 13, further comprising a fifth step of changing the thickness of said semiconductor body after said fourth step.

15. A method according to claim 12, further comprising a fourth step of changing the thickness of said semiconductor body after said third step.

* * * * *